(12) United States Patent
Ishibashi et al.

(10) Patent No.: US 9,735,100 B2
(45) Date of Patent: Aug. 15, 2017

(54) SEMICONDUCTOR DEVICE AND METHOD OF MANUFACTURING THE SAME

(71) Applicant: MITSUBISHI ELECTRIC CORPORATION, Tokyo (JP)

(72) Inventors: Hidetoshi Ishibashi, Tokyo (JP);
Yoshihiro Yamaguchi, Tokyo (JP);
Naoki Yoshimatsu, Tokyo (JP);
Hidehiro Koga, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 412 days.

(21) Appl. No.: 14/051,310

(22) Filed: Oct. 10, 2013

(65) Prior Publication Data

US 2014/0217569 A1 Aug. 7, 2014

(30) Foreign Application Priority Data

Feb. 6, 2013 (JP) ................... 2013-021030

(51) Int. Cl.
*H01L 23/48* (2006.01)
*H01L 21/44* (2006.01)
(Continued)

(52) U.S. Cl.
CPC .............. *H01L 23/50* (2013.01); *H01L 24/36* (2013.01); *H01L 24/40* (2013.01); *H01L 25/072* (2013.01);
(Continued)

(58) Field of Classification Search
CPC ....... H01L 2924/00; H01L 2224/73265; H01L 2224/48227; H01L 2924/15311;
(Continued)

(56) References Cited

U.S. PATENT DOCUMENTS 5,666,003 A 9/1997 Shibata et al.
2008/0087994 A1 4/2008 Yokomae et al.
(Continued)

FOREIGN PATENT DOCUMENTS

CN 102237347 A 11/2011
JP 08-125092 A 5/1996
(Continued)

OTHER PUBLICATIONS

An Office Action issued by the German Patent Office on Oct. 10, 2014, which corresponds to German Patent Application No. 10 2013 225 135.1 and is related to U.S. Appl. No. 14/051,310; with English language partial translation.
(Continued)

*Primary Examiner* — Hsien Ming Lee
(74) *Attorney, Agent, or Firm* — Studebaker & Brackett PC

(57) ABSTRACT

A semiconductor device according to the present invention includes a plurality of semiconductor chips, a plate electrode disposed on the plurality of semiconductor chips for connecting the plurality of semiconductor chips, and an electrode disposed on the plate electrode. The electrode has a plurality of intermittent bonding portions to be bonded to the plate electrode and a protruded portion which is protruded erectly from the bonding portions. The protruded portion has an ultrasonic bonding portion which is parallel with the bonding portion and is ultrasonic bonded to an external electrode.

15 Claims, 5 Drawing Sheets

(51) Int. Cl.
*H01L 23/50* (2006.01)
*H01L 25/00* (2006.01)
*H01L 25/07* (2006.01)
*H01L 23/00* (2006.01)
H01L 23/373 (2006.01)
H01L 23/433 (2006.01)
H01L 23/492 (2006.01)
H01L 23/495 (2006.01)

(52) U.S. Cl.
CPC .......... *H01L 25/50* (2013.01); *H01L 23/3735* (2013.01); *H01L 23/4334* (2013.01); *H01L 23/492* (2013.01); *H01L 23/49562* (2013.01); *H01L 2224/40095* (2013.01); *H01L 2224/40137* (2013.01); *H01L 2924/1305* (2013.01); *H01L 2924/1306* (2013.01); *H01L 2924/13055* (2013.01); *H01L 2924/13091* (2013.01); *H01L 2924/181* (2013.01)

(58) Field of Classification Search
CPC . H01L 2224/73204; H01L 2224/85205; H01L 2224/73253; H01L 2224/75205
USPC ........ 257/678, 684, 687, 690, 734; 438/106, 438/107, 109, 613, 614, 652
See application file for complete search history.

(56) References Cited

U.S. PATENT DOCUMENTS

| | | | |
|---|---|---|---|
| 2009/0209065 A1* | 8/2009 | Nishiuchi et al. | 438/113 |
| 2011/0260315 A1* | 10/2011 | Yamaguchi et al. | 257/696 |
| 2012/0074516 A1 | 3/2012 | Yamaguchi et al. | |

FOREIGN PATENT DOCUMENTS

| JP | 2000-232187 A | 8/2000 |
|---|---|---|
| JP | 2000-232189 A | 8/2000 |
| JP | 2004-363295 A | 12/2004 |
| JP | 2006-049456 A | 2/2006 |
| JP | 2006-278415 A | 10/2006 |
| JP | 2007-103810 A | 4/2007 |
| JP | 2008-010618 A | 1/2008 |
| JP | 2008-098586 A | 4/2008 |
| JP | 2010-103222 A | 5/2010 |
| JP | 2010-147053 A | 7/2010 |
| JP | 2010-219419 A | 9/2010 |
| JP | 2011-216766 A | 10/2011 |
| JP | 2011-228528 A | 11/2011 |
| JP | 2012-074543 A | 4/2012 |
| JP | 2012-142466 A | 7/2012 |
| JP | 5012772 B2 | 8/2012 |

OTHER PUBLICATIONS

An Office Action issued by the Chinese Patent Office on Mar. 14, 2016, which corresponds to Chinese Patent Application No. 201410045198.5 and is related to U.S. Appl. No. 14/051,310; with English language partial translation.

An Office Action issued by the Japanese Patent Office on Dec. 15, 2015, which corresponds to Japanese Patent Application No. 2013-021030 and is related to U.S. Appl. No. 14/051,310; with English language translation.

An Office Action; "Notification of Reasons for Refusal" issued by the Japanese Patent Office on Aug. 16, 2016, which corresponds to Japanese Patent Application No. 2013-021030 and is related to U.S. Appl. No. 14/051,310; with English language partial translation.

An Office Action; "Notice of Reasons for Rejection," issued by the Japanese Patent Office on Apr. 4, 2017, which corresponds to Japanese Patent Application No. 2013-021030 and is related to U.S. Appl. No. 14/051,310.

A second Office Action issued by the Chinese Patent Office on Nov. 1, 2016, which corresponds to Chinese Patent Application No. 201410045198.5 and is related to U.S. Appl. No. 14/051,310; with English language partial translation.

An Office Action issued by the Chinese Patent Office dated May 3, 2017, which corresponds to Chinese Patent Application No. 201410045198.5 and is related to U.S. Appl. No. 14/051,310; with partial English language translation.

\* cited by examiner

SEMICONDUCTOR DEVICE AND METHOD OF MANUFACTURING THE SAME

BACKGROUND OF THE INVENTION

Field of the Invention

The present invention relates to an electrode structure of a semiconductor device and a method of manufacturing the same.

Description of the Background Art

A package such as a power MOSFET (Metal Oxide Semiconductor Field Effect Transistor) and an IGBT (Insulated Gate Bipolar Transistor) which is a power semiconductor device is often formed by resin sealing through transfer molding in respect of a manufacturing cost, a productivity and the like.

Japanese Patent No. 5012772 discloses that an electrode erected on a surface of a sealing resin is exposed in consideration of reduction in size of the device and convenience of wiring. Moreover, Japanese Patent Application Laid-Open No. 2012-74543 discloses the technique for reducing a power loss by using a direct lead bonding method for directly connecting an emitter electrode and a lead terminal in place of connection of both the electrodes through a bonding wire in a semiconductor device subjected to transfer molding. Moreover, it is described that an electrode post erected and bonded onto a plate electrode is exposed to an outside.

In a semiconductor device using an SiC chip, particularly, there is some action for development to aim at an operation at 175° C. or more which is higher than an IGBT according to the related art. When a request for the high temperature operation is given to the semiconductor device described in the Japanese Patent Application Laid-Open No. 2012-74543, it is desirable that the external electrode should be bonded through ultrasonic bonding in place of solder bonding.

In the case where an ultrasonic bonding method is used, however, there is a fear that a bonding portion on a base of an electrode post exposed to the outside might be molten due to transmission of heat generated in the bonding to the bonding portion. Furthermore, there is also a fear that breakdown such as a crack might occur in the bonding portion due to an ultrasonic vibration. In particular, an electrode on an emitter side (a source side) disposed on a direct lead diffuses heat in the bonding with more difficulty than an electrode on a collector side (a drain side) to be bonded to a structure for dissipating heat, for example, a heat spreader, so that a possibility of breakdown is higher.

SUMMARY OF THE INVENTION

It is an object of the present invention to provide a semiconductor device having a direct lead bonding structure which has high reliability of a bonding portion and a method of manufacturing the same.

A first semiconductor device according to the present invention includes a plurality of semiconductor chips, a plate electrode and an electrode. The plate electrode is disposed on the semiconductor chips and connects the semiconductor chips. The electrode is disposed on the plate electrode. The electrode has a plurality of intermittent bonding portions to be bonded to the plate electrode and a protruded portion which is protruded erectly from the bonding portions. The protruded portion has an ultrasonic bonding portion which is parallel with the bonding portion and is ultrasonic bonded to an external electrode.

In the first semiconductor device according to the present invention, the electrode is bonded to the plate electrode in two places or more. Therefore, a vibration or heat in the ultrasonic bonding is dispersed to each of the bonding portions, so that melting or a crack occurs with difficulty.

A second semiconductor device according to the present invention includes a plurality of semiconductor chips and a plate electrode. The plate electrode is disposed on the plurality of semiconductor chips. The plate electrode has a bonding plate portion and a protruded portion. The bonding plate portion is bonded to the plurality of semiconductor chips and connects the plurality of semiconductor chips. The protruded portion is protruded erectly from the bonding plate portion. The protruded portion has an ultrasonic bonding portion which is parallel with the bonding plate portion and to which an external electrode is ultrasonic bonded.

In the second semiconductor device according to the present invention, the plate electrode is bonded to the plurality of semiconductor chips. Therefore, a vibration or heat in the ultrasonic bonding is dispersed to each of the bonding portions, so that melting or a crack occurs with difficulty.

A first method of manufacturing a semiconductor device according to the present invention includes the steps (a), (b), (c) and (d). In the step (a), a plate electrode is bonded onto a plurality of semiconductor chips, thereby connecting the semiconductor chips. In the step (b), an electrode including a plurality of intermittent bonding portions and a protruded portion having an ultrasonic bonding portion which is parallel with the bonding portions and protruded erectly from the bonding portions is disposed on the plate electrode, and the bonding portions are bonded to the plate electrode. In the step (c), the semiconductor chips, the plate electrode and the electrode are sealed with a sealing resin in such a manner that a surface of the ultrasonic bonding portion at an opposite side to the bonding portion is exposed. In the step (d), an external electrode is ultrasonic bonded to the surface of the ultrasonic bonding portion at the opposite side to the bonding portion.

In the first method of manufacturing a semiconductor device according to the present invention, the electrode is bonded to the plate electrode in a plurality of places in the step (b). Therefore, it is possible to manufacture a semiconductor device in which a vibration or heat in the ultrasonic bonding is dispersed to each of the bonding portions and melting or a crack occurs with difficulty.

A second method of manufacturing a semiconductor device according to the present invention includes the steps (a), (b), (c) and (d). In the step (a), a plate electrode including a plurality of bonding plate portions and a protruded portion having an ultrasonic bonding portion which is parallel with the bonding plate portions and protruded erectly from the bonding plate portions is disposed on a plurality of semiconductor chips, and the bonding plate portion is bonded to the semiconductor chips. In the step (b), the semiconductor chips and the plate electrode are sealed with a sealing resin in such a manner that a surface of the ultrasonic bonding portion at an opposite side to the bonding plate portion is exposed. In the step (c), an external electrode is ultrasonic bonded to the surface of the ultrasonic bonding portion at the opposite side to the bonding plate portion.

In the second method of manufacturing a semiconductor device according to the present invention, the plate electrode is bonded to the semiconductor chips in the step (a). Therefore, it is possible to manufacture a semiconductor device in which a vibration or heat in the ultrasonic bonding is dispersed to each of the bonding portions and melting or a crack occurs with difficulty.

These and other objects, features, aspects and advantages of the present invention will become more apparent from the following detailed description of the present invention when taken in conjunction with the accompanying drawings.

DESCRIPTION OF THE PREFERRED EMBODIMENTS

A. Technical Premise

Figure 9:
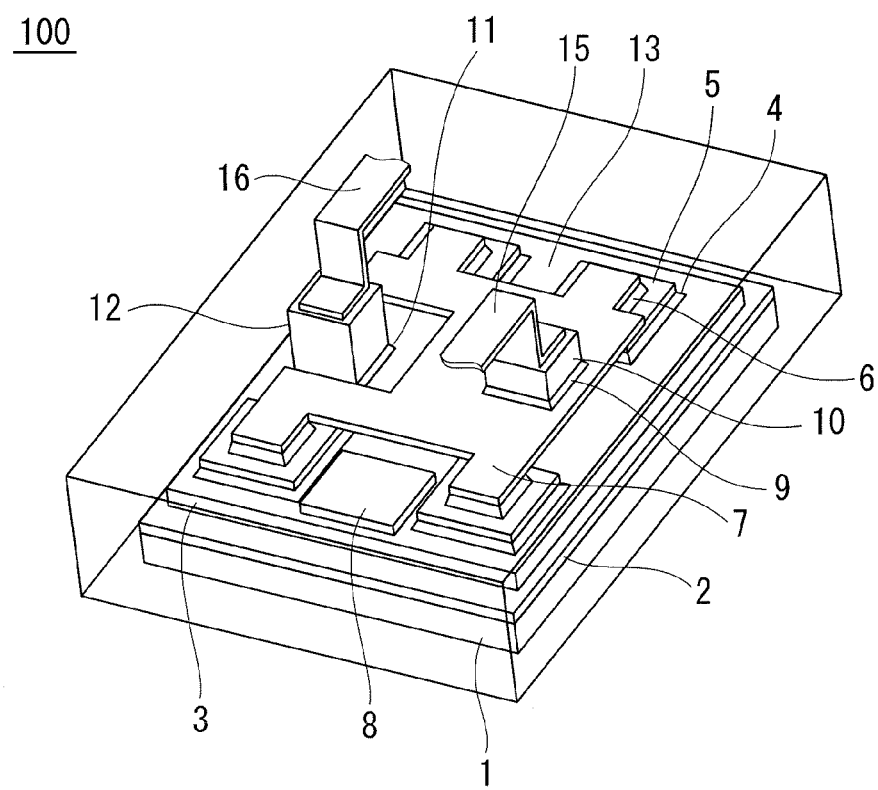
FIG. 9 is a perspective view showing a semiconductor device according to the technical premise.

FIG. 9 is a perspective view showing a structure of a semiconductor device 100 according to the technical premise of the present invention. The semiconductor device 100 includes a base plate 1, an insulating layer 2, a heat spreader 3, a semiconductor chip 5, a plate electrode 7, a controlling drive board 8, and electrode posts 10 and 12. The base plate 1 is formed of a metal having a high thermal conductivity, for example, copper, AlSiC or the like. The insulating layer 2 is provided on the base plate 1 and the heat spreader 3 is provided on the insulating layer 2. The semiconductor chip 5 is die bonded onto the heat spreader 3 by using a bonding material 4 such as a solder. The plate electrode 7 is connected onto the semiconductor chip 5 by using a bonding material 6 such as a solder and silver. The electrode post 10 is connected onto the plate electrode 7 by using a bonding material 9 such as a solder and silver. Moreover, the electrode post 12 is connected onto the heat spreader 3 through a bonding material 11.

In addition, the controlling drive board 8 for carrying out gate driving of an IGBT is mounted on the heat spreader 3. The controlling drive board 8 is connected to a gate pad or an emitter (source) pad of the semiconductor chip by a conductor such as an aluminum wire, which is not shown. An emitter relay terminal, a gate relay terminal or the like is connected to the controlling drive board 8, and the controlling drive board 8 is connected to a printed circuit board through the terminals. The semiconductor chip 5 is controlled in response to an external signal through the controlling drive board 8.

The structure described above serves as an insert component 13 and is sealed with a sealing resin 14 by transfer molding. However, surfaces of the electrode posts 10 and 12 are exposed from the sealing resin 14 and are connected to external electrodes 15 and 16 through solder bonding, ultrasonic bonding or the like, respectively.

In a semiconductor device which has a large capacity with a rated current of approximately one hundred amperes or more and is required to be operated at a high temperature, it is desirable to use metal bonding such as an ultrasonic bonding method in order to connect the external electrodes 15 and 16 to the electrode posts 10 and 12, respectively. In the ultrasonic bonding method, however, there is a fear that heat generated in the bonding might be transmitted to the electrode posts 10 and 12 and the bonding materials 9 and 11 provided on the base might be thus molten. Furthermore, a vibration is also transmitted in the ultrasonic bonding. For this reason, there is a possibility that breakdown such as a crack might occur in the bonding materials 9 and 11. In particular, the electrode post 10 to be disposed on the plate electrode 7 diffuses the heat in the bonding with more difficulty than the electrode post 12 to be bonded to the heat spreader 3. For this reason, the bonding material tends to be broken.

In the present invention, therefore, a connecting place of the electrode having a bonding surface to the external electrode and the insert component 13 is devised, so that a bonding material to the insert component 13 is prevented from being broken due to the ultrasonic bonding to the external electrode.

B. First Preferred Embodiment

<B-1. Structure>

Figure 1:
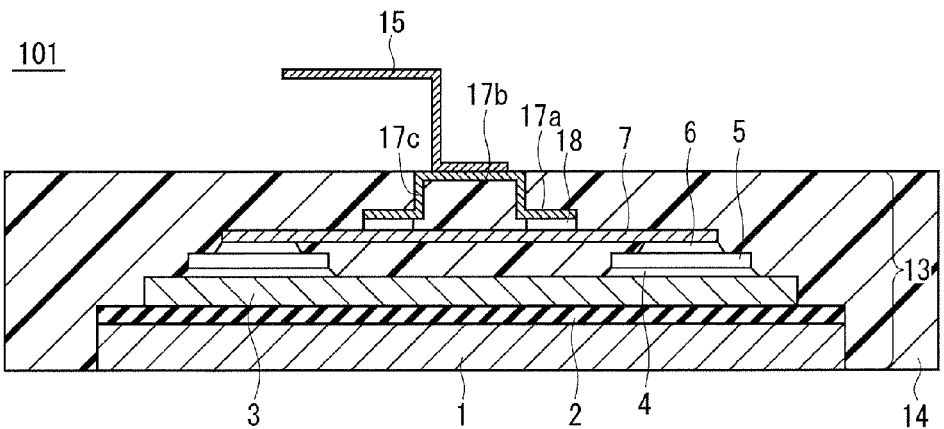
FIG. 1 is a sectional view showing a semiconductor device according to a first preferred embodiment.

FIG. 1 is a sectional view showing a structure of a semiconductor device 101 according to a first preferred embodiment. The semiconductor device 101 includes a base plate 1, an insulating layer 2, a heat spreader 3, a semiconductor chip 5, a plate electrode 7, a controlling drive board (not shown), an electrode 17 and an external electrode 15. The base plate 1 is formed of a metal having a high thermal conductivity such as copper and AlSiC. The insulating layer 2 is provided on the base plate 1, and the heat spreader 3 is provided on the insulating layer 2. The semiconductor chip 5 is die bonded onto the heat spreader 3 by using a bonding material 4 such as a solder. The plate electrode 7 is connected onto the semiconductor chip 5 by using a bonding material 6 such as a solder and silver.

The electrode 17 is connected onto the plate electrode 7 by using a bonding material 18. The electrode 17 is fabricated by bending, drawing or the like for Cu or Al and has a plurality of intermittent bonding portions 17a for the plate electrode 7 and a protruded portion which is protruded erectly from the bonding portion 17a. It is to be noted that the "intermittent" imply a mode in which the bonding portions 17a are not linked to each other but are disposed discretely as seen on a plane. The protruded portion has an ultrasonic bonding portion 17b which is parallel with the bonding portion 17a, and a conducting portion 17c for connecting the ultrasonic bonding portion 17b and the bonding portion 17a. Although FIG. 1 shows the conducting portion 17c which is perpendicular to the bonding portion 17a, an angle formed by the conducting portion 17c and the bonding portion 17a is optional.

The controlling drive board for carrying out gate driving of an IGBT is mounted on the heat spreader 3. The controlling drive board is connected to a gate pad or an emitter (source) pad of the semiconductor chip 5 by a conductor such as an aluminum wire, which is not shown. An emitter relay terminal, a gate relay terminal or the like is connected to the controlling drive board, and the controlling drive board is connected to a printed circuit board through the terminals. It is possible to control the semiconductor chip 5 in response to an external signal through the controlling drive board.

Moreover, an electrode (not shown) is connected onto the heat spreader 3 through a bonding material. The electrode may have the heat spreader 3 and a plurality of bonding portions in the same manner as the electrode 17.

The structure described above serves as the insert component 13 and is sealed with a sealing resin 14 by transfer molding. At this time, an upper surface of the electrode (not shown) connected onto the heat spreader 3 and an upper surface of the ultrasonic bonding portion 17b come in face contact with an upper mold (not shown) of a transfer mold so that an excellent sealing property can be obtained. The external electrode 15 is ultrasonic bonded to the ultrasonic bonding portion 17b of the electrode 17 which is exposed from the sealing resin 14 and the electrode (not shown) provided on the heat spreader 3. The external electrode 15 has a connecting portion to a bus bar of a driving device and the semiconductor device 101 serves as a part of a driving circuit in the driving device.

The electrode 17 has the bonding portions 17a to the plate electrode 7. Therefore, heat and a vibration in the ultrasonic bonding to the external electrode 15 are dispersed to the bonding portions 17a, so that damage to the bonding material 18 of the electrode 17 and the plate electrode 7 is reduced. By disposing the conducting portion 17c for connecting the ultrasonic bonding portion 17b and the bonding portion 17a to each other in the electrode 17 orthogonally to a vibrating direction of a tool for the ultrasonic bonding, moreover, it is possible to prevent a stress generated by an ultrasonic vibration from concentrating in a boundary between the bonding portion 17a and the conducting portion 17c. Thus, the damage to the bonding material 18 can be reduced.

<B-2. Variant>

Figure 2:
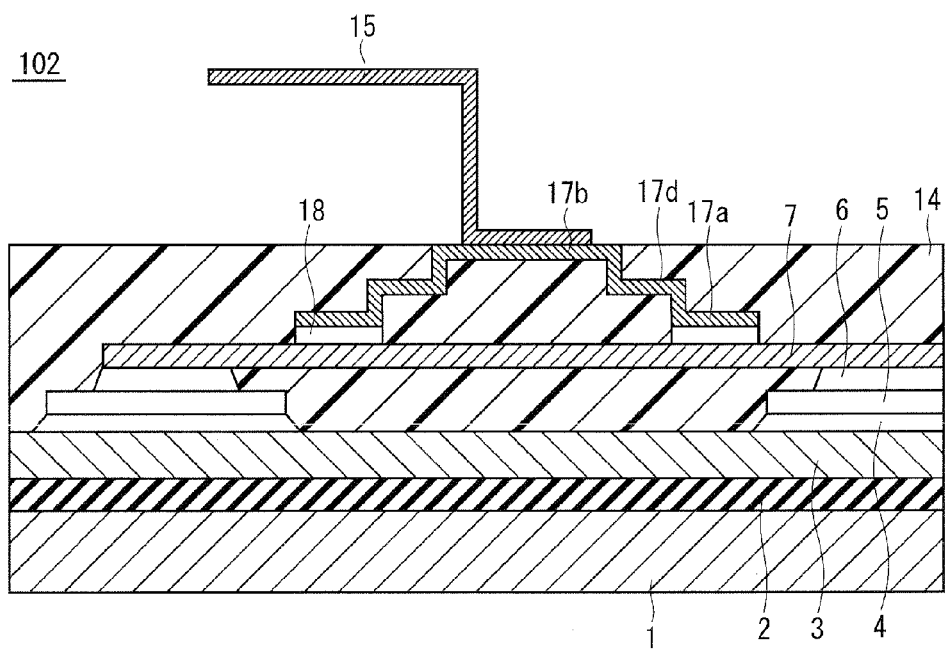
FIG. 2 is a sectional view showing a semiconductor device according to a variant of the first preferred embodiment.

FIG. 2 is a sectional view showing a structure of a semiconductor device 102 according to a variant of the first preferred embodiment. The structure of the semiconductor device 102 is the same as that of the semiconductor device 101 except that the conducting portion 17c of the electrode 17 takes a step bending shape. The conducting portion 17c is caused to take the step bending shape so that a stress or heat generated by a vibration in ultrasonic bonding concentrates in a corner of the step bending shape. Therefore, the stress of the bonding portion 17a is relieved. The number of steps in the step bending shape is optional.

<B-3. Effects>

The semiconductor devices 101 and 102 according to the first preferred embodiment include the plurality of semiconductor chips 5, the plate electrode 7 disposed on the plurality of semiconductor chips 5 and connecting the plurality of semiconductor chips 5, and the electrode 17 disposed on the plate electrode 7, the electrode 17 has the plurality of intermittent bonding portions 17a to be bonded to the plate electrode 7, and the protruded portion which is protruded erectly from the plurality of bonding portions 17a, and the protruded portion has an ultrasonic bonding portion which is parallel with the plurality of bonding portions 17a and is ultrasonic bonded to the external electrode 15. The electrode 17 is bonded to the plate electrode 7 in two places or more. Therefore, the vibration or heat in the ultrasonic bonding is dispersed to each of the bonding portions 17a, so that the bonding member is molten or cracked with difficulty.

Moreover, the semiconductor devices 101 and 102 further include the sealing resin 14 for sealing a part of the electrode 17, the semiconductor chip 5, and the plate electrode 7, and the ultrasonic bonding portion 17b of the electrode 17 is exposed from the sealing resin 14. Accordingly, the external electrode 15 can be ultrasonic bonded to the ultrasonic bonding portion 17b.

Moreover, the protruded portion of the electrode 17 takes a step bending shape for the conducting portion 17c between the bonding portion 17a and the ultrasonic bonding portion 17b. Accordingly, a stress or heat generated by a vibration in the ultrasonic bonding or a stress generated in mold clamping is dispersed to a corner taking the step bending shape. Therefore, the bonding material 18 is molten or cracked with difficulty.

C. Second Preferred Embodiment

<C-1. Structure>

Figure 3:
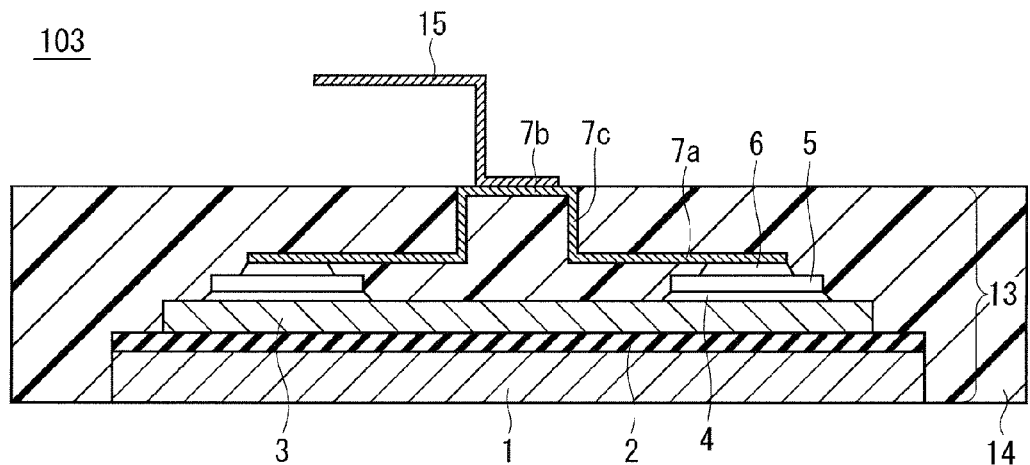
FIG. 3 is a sectional view showing a semiconductor device according to a second preferred embodiment.

FIG. 3 is a sectional view showing a structure of a semiconductor device 103 according to a second preferred embodiment. Although the electrode 17 to be ultrasonic bonded to the external electrode 15 is provided in the first preferred embodiment, the electrode 17 is eliminated and an external electrode 15 is ultrasonic bonded to a plate electrode 7 in the second preferred embodiment. For this reason, the plate electrode 7 of the semiconductor device 103 has a bonding plate portion 7a to be bonded to a plurality of semiconductor chips 5 and a protruded portion which is protruded erectly from the bonding plate portion 7a. The protruded portion of the plate electrode 7 includes an ultrasonic bonding portion 7b which is parallel with the bonding plate portion 7a and to which the external electrode 15 is ultrasonic bonded, and a conducting portion 7c for coupling the ultrasonic bonding portion 7b and the bonding plate portion 7a. The shape of the plate electrode 7 is taken by bending or drawing of Cu or Al. Since the structure of the semiconductor device 103 is the same as that of the semiconductor device 101 according to the first preferred embodiment except that ultrasonic bonding to the external electrode 15 is carried out through the plate electrode 7 in place of the electrode 17, description will be omitted.

An insert component 13 including a base plate 1, an insulating layer 2, a heat spreader 3, the semiconductor chip 5 and the plate electrode 7 is sealed with a sealing resin 14 by transfer molding. At this time, the ultrasonic bonding portion 7b of the plate electrode 7 and an upper surface of an electrode (not shown) provided on the heat spreader 3 come in face contact with an upper mold (not shown) of a transfer mold, so that an excellent sealing property can be obtained. The external electrode 15 is ultrasonic bonded to the ultrasonic bonding portion 7b of the plate electrode 7 exposed from the sealing resin 14 and the upper surface of the electrode (not shown) provided on the heat spreader 3.

By ultrasonic bonding the external electrode 15 to the plate electrode 7, it is possible to eliminate the bonding portion of the electrode 17 exposed to the outside of the sealing resin 14 and the plate electrode 7 according to the related art. When the external electrode 15 is to be ultrasonic bonded to the ultrasonic bonding portion 7b of the plate electrode 7, a vibration and heat are applied to the plate electrode 7. Since the vibration and the heat are dispersed to the bonding plate portions 7a, however, it is possible to reduce damage to a bonding material 6, thereby suppressing a crack or melting.

If the conducting portion 7c is disposed orthogonally to a vibrating direction of an ultrasonic bonding tool, moreover, a stress generated by an ultrasonic vibration can be prevented from concentrating in a boundary between the bonding plate portion 7a and the conducting portion 7c.

<C-2. Variant>

Figure 4:
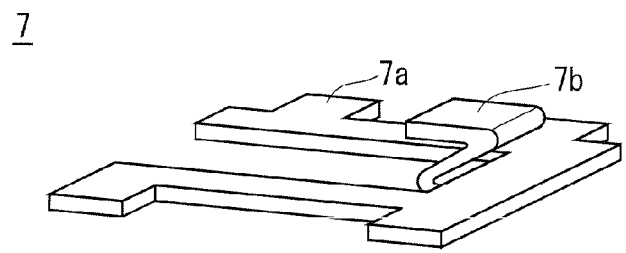
FIG. 4 is a perspective view showing a plate electrode according to a variant of the second preferred embodiment.

FIG. 4 is a perspective view showing a structure of a plate electrode 7 in a semiconductor device 104 according to a variant of the second preferred embodiment. In the variant, a protruded portion of the plate electrode 7 is formed by bending an end of a bonding plate portion 7a to take an almost S shape. An upper part of the almost S shape serves as an ultrasonic bonding portion 7b which is parallel with the bonding plate portion 7a. The ultrasonic bonding portion 7b is exposed from a sealing resin 14 and an external electrode 15 is ultrasonic bonded thereto. Here, the almost S shape indicates such a shape that a bottom part and an upper part (the ultrasonic bonding portion 7b) which is parallel with the bottom part are provided and are coupled to each other through a conducting portion 7c which is extended from the bottom part at an elevation angle of less than 90°. The conducting portion 7c may be disposed orthogonally to a vibrating direction of the ultrasonic bonding.

By setting the ultrasonic bonding portion 7b to take the almost S shape, it is possible to relieve damage to a bonding material 6 due to a stress, a vibration or heat in the ultrasonic bonding and to relax a stress in mold clamping in transfer molding.

Figure 5:
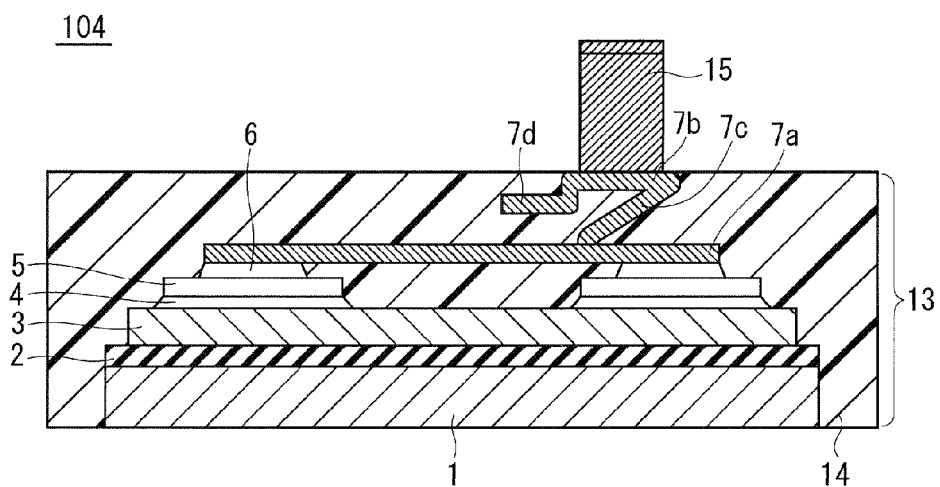
FIG. 5 is a sectional view showing a semiconductor device according to the variant of the second preferred embodiment.

FIG. 5 is a sectional view showing a structure of the semiconductor device 104. The plate electrode 7 shown in FIG. 5 has a heat radiating portion 7d formed therein. The heat radiating portion 7d is linked to an end of the ultrasonic bonding portion 7b which is not linked to the plate electrode 7, and is sealed with the sealing resin 14. Heat is promoted to be radiated from the plate electrode 7 through the heat radiating portion 7d, and furthermore, an adhesion area to the sealing resin 14 is increased so that an excellent ultrasonic bonding properly can be obtained.

<C-3. Effects>

The semiconductor devices 103 and 104 according to the second preferred embodiment include the plurality of semiconductor chips 5 and the plate electrode 7 disposed on the plurality of semiconductor chips 5, the plate electrode 7 has the bonding plate portion 7a bonded to the plurality of semiconductor chips 5 and connecting the plurality of semiconductor chips 5, and the protruded portion which is protruded erectly from the bonding plate portion 7a, and the protruded portion has the ultrasonic bonding portion 7b which is parallel with the bonding plate portion 7a and to which the external electrode 15 is ultrasonic bonded. The bonding electrode 17 to the external electrode 15 which is conventionally provided on the plate electrode 7 is eliminated and the plate electrode 7 is provided with the ultrasonic bonding portion 7b for bonding the external electrode 15. Consequently, there is solved the problem in that the breakdown is caused by the heat or vibration in the ultrasonic bonding in the bonding place of the electrode 17 and the plate electrode 7. Although the plate electrode 7 is bonded to the semiconductor chips 5 through the bonding material 6, the vibration or heat generated in the plate electrode 7 in the ultrasonic bonding is dispersed to these bonding places. Therefore, the bonding material 6 can be prevented from being broken.

Moreover, the semiconductor devices 103 and 104 further include the sealing resin 14 for sealing a part of the plate electrode 7 and the semiconductor chip 5, and a surface of the ultrasonic bonding portion 7b of the plate electrode 7 at an opposite side to the bonding plate portion 7a is exposed from the sealing resin 14. Consequently, it is possible to ultrasonic bond the external electrode 15 to an exposed surface of the ultrasonic bonding portion 7b from the sealing resin 14.

Furthermore, the erecting shape in the plate electrode 7 is the almost S shape. By setting the protruded portion of the plate electrode 7 to take the almost S shape, it is possible to relieve a mold clamping stress in the transfer molding step, thereby relaxing damage to be applied to the bonding material 6 of the plate electrode 7 and the semiconductor chip 5. Moreover, there is also relieved a vibration in the ultrasonic bonding of the external electrode 15 to the ultrasonic bonding portion 7b. Furthermore, a length of the conducting portion 7c is increased so that heat radiating performance can be enhanced and the damage to the bonding portion due to the heat generated in the ultrasonic bonding can be thus relieved.

In addition, the plate electrode 7 includes the heat radiating portion 7d which is linked from the end of the ultrasonic bonding portion 7b and is not linked to the bonding plate portion 7a. By radiating heat from the heat radiating portion 7d to the sealing resin 14, it is possible to enhance the heat radiating performance of the plate electrode 7. Moreover, a contact area of the plate electrode 7 and the sealing resin 14 is increased. Therefore, it is possible to suppress the vibration of the bonded member (the plate electrode 7) in the ultrasonic bonding by an anchor effect, thereby enhancing an ultrasonic bonding property.

D. Third Preferred Embodiment

<D-1. Ultrasonic Bonding Method>

Figure 6:
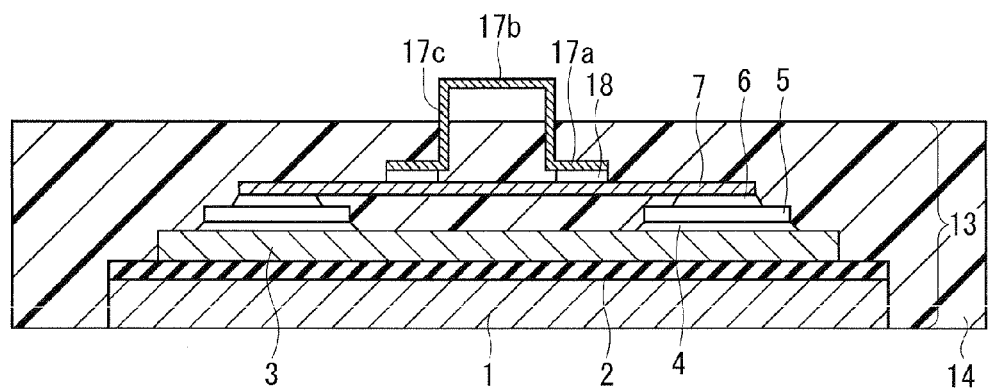
FIG. 6 is a sectional view showing a semiconductor device according to a third preferred embodiment.

FIG. 6 is a sectional view showing a structure of a semiconductor device 105 according to a third preferred embodiment. The semiconductor device 105 is different from the semiconductor device 101 according to the first preferred embodiment in that a part of the conducting portion 17c as well as the surface of the ultrasonic bonding portion 17b of the electrode 17 are exposed from the sealing resin 14. Since the other structures are the same as those of the semiconductor device 101, description will be omitted.

Figure 7:
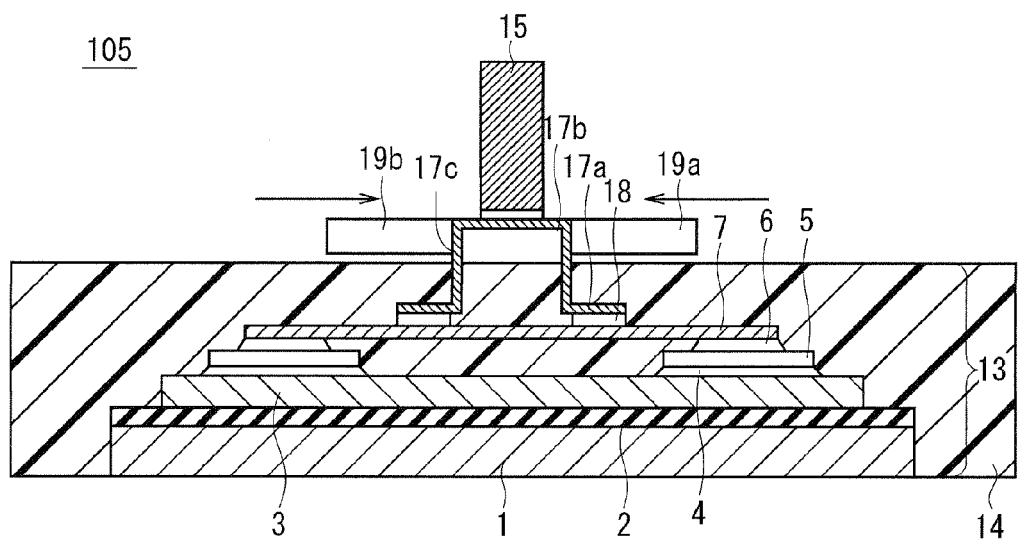
FIG. 7 is a sectional view showing a method of manufacturing the semiconductor device according to the third preferred embodiment.

Both of two conducting portions 17c are perpendicular to the ultrasonic bonding portion 17b and are opposed to each other with the ultrasonic bonding portion 17b interposed therebetween. Tools 19a and 19b are caused to come in contact with the two conducting portions 17c as shown in FIG. 7, and pressurization is carried out by them in an orthogonal direction to the conducting portion 17c shown in an arrow of FIG. 7, that is, toward the ultrasonic bonding portion 17b side, and at the same time, ultrasonic bonding is performed.

The electrode 17 is fixed in the interposing state between the tools 19a and 19b. Therefore, a vibration is prevented from being caused by the ultrasonic bonding so that breakdown of a bonding material 18 to a plate electrode 7 is suppressed. Moreover, heat generated in the ultrasonic bonding can be dissipated to the tools 19a and 19b. Therefore, the bonding material 18 can be prevented from being molten.

It is desirable that the tools 19a and 19b should be driven by the same device as an ultrasonic bonding tool 22. An electrode 23 can be pressurized by using a cam mechanism or the like.

Also in the case where only the tool 19a is used to pressurize the electrode 17 from a single side, for example, it is possible to obtain the above-mentioned effect by fixing the electrode 17.

Moreover, contact surfaces of the tools 19a and 19b with the electrode 17 are provided with a large number of projecting shapes or are subjected to a surface roughening process to increase friction force with the electrode 17. Consequently, it is possible to strongly fix the electrode 17.

Moreover, a silicone rubber having a high thermal conductivity is provided on the contact surfaces of the tools 19a and 19b with the electrode 17. Consequently, it is possible to absorb the vibration of the electrode 17 and to enhance an adhesive property of the electrode 17 and the tools 19a and 19b, thereby reducing a thermal contact resistance.

<D-2. Variant>

Although FIGS. 6 and 7 show the mode in which the ultrasonic bonding is carried out in the fixing state through the tools 19a and 19b over the semiconductor device 101 according to the first preferred embodiment, the tools 19a and 19b can be caused to come in contact with a pair of side surfaces to fix the bonding member thereto as long as the bonding member to the external electrode 15 takes such a shape as to have the pair of side surfaces which are perpendicular to the ultrasonic bonding surface and are opposed to each other. Therefore, it is also possible to apply the present preferred embodiment to the semiconductor device 102 having the step bending portion in the electrode 17 and the semiconductor device 103 according to the second preferred embodiment.

Figure 8:
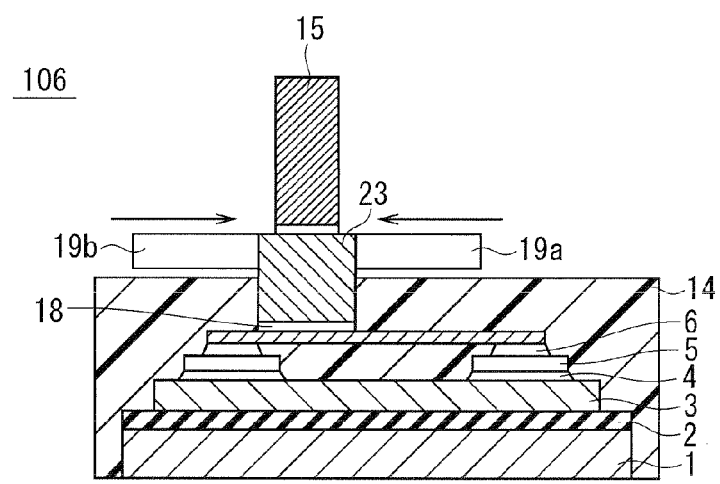
FIG. 8 is a sectional view showing a method of manufacturing a semiconductor device according to a variant of the third preferred embodiment.

As in a semiconductor device 106 shown in FIG. 8, moreover, the electrode 23 for connecting to the external electrode 15 may take a shape of a rectangular parallelepiped. A structure of the semiconductor device 106 is the same as that of the semiconductor device 101 according to the first preferred embodiment except that the electrode 23 takes the shape of the rectangular parallelepiped and a bonding portion to a plate electrode is provided in a single place. The bonding portion of the electrode 23 to the plate electrode is provided in the single place. For this reason, there is a problem in that the bonding portion is broken by a vibration or heat in ultrasonic bonding. However, the electrode 23 is fixed by carrying out pressurization in a direction of an arrow in the drawing through the tools 19a and 19b coming in contact with side surfaces 23b and 23c of the electrode 23. Therefore, the vibration is prevented from being caused by the ultrasonic bonding. Thus, it is possible to prevent the bonding portion to the plate electrode 7 from being broken. Moreover, the heat generated in the ultrasonic bonding can be dissipated to the tools 19a and 19b. Consequently, the bonding portion can be prevented from being molten.

<D-3. Effects>

The method of manufacturing a semiconductor device according to the third preferred embodiment includes the steps of (a) bonding the plate electrode 7 onto the semiconductor chips 5, thereby connecting the semiconductor chips 5, (b) disposing, on the plate electrode 7, the electrode 17 including the plurality of intermittent bonding portions 17a and the protruded portion having the ultrasonic bonding portion 17b which is parallel with the bonding portions 17a and protruded erectly from the bonding portions 17a, and bonding the bonding portions 17a to the plate electrode 7, (c) sealing the semiconductor chips 5, the plate electrode 7 and the electrode 17 with the sealing resin 14 in such a manner that the surface of the ultrasonic bonding portion 17b at the opposite side to the bonding portion 17a is exposed, and (d) ultrasonic bonding the external electrode 15 to the surface of the ultrasonic bonding portion 17b at the opposite side to the bonding portion 17a. The electrode 17 is bonded to the plate electrode 7 in a plurality of places. Therefore, a vibration or heat in the ultrasonic bonding is dispersed to each of the bonding portions 17a. Consequently, it is possible to manufacture a semiconductor device in which melting or a crack occurs with difficulty.

Moreover, the protruded portion of the electrode 17 has a pair of side surfaces which is perpendicular to the surface of the ultrasonic bonding portion 17b at the opposite side to the bonding portion 17a, and the step (c) serves to seal the semiconductor chips 5, the plate electrode 7 and the electrode 17 with the sealing resin 14 in such a manner that at least a part of each of the pair of side surfaces is exposed, and the step (d) serves to carry out the ultrasonic bonding while performing pressurization with the pair of side surfaces exposed from the sealing resin 14 interposed from both sides by the tools 19a and 19b (pressurizing members). The electrode 17 is fixed in the interposing state between the tools 19a and 19b. Consequently, a vibration can be prevented from being generated by the ultrasonic bonding, so that the breakdown of the bonding material 18 to the plate electrode 7 can be suppressed. Moreover, the heat generated in the ultrasonic bonding can be dissipated to the tools 19a and 19b. Therefore, the bonding material 18 can be prevented from being molten.

Furthermore, the tools 19a and 19b have a silicone rubber on the contact surfaces with the pair of side surfaces. Therefore, the vibration of the electrode 23 can be absorbed, and an adhesive property of the electrode 23 and the tools 19a and 19b can be enhanced so that a thermal contact resistance can be reduced.

Another method of manufacturing a semiconductor device according to the third preferred embodiment includes the steps of (a) disposing, on the semiconductor chips 5, the plate electrode 7 including the plurality of bonding plate portions 7a and the protruded portion having the ultrasonic bonding portion 7b which is parallel with the bonding plate portions 7a and protruded erectly from the bonding plate portions 7a, and bonding the bonding plate portion 7a to the semiconductor chips 5, (b) sealing the semiconductor chips 5 and the plate electrode 7 with the sealing resin 14 in such a manner that the surface of the ultrasonic bonding portion 7b at the opposite side to the bonding plate portion 7a is exposed, and (c) ultrasonic bonding the external electrode 15 to the surface of the ultrasonic bonding portion 7b at the opposite side to the bonding plate portion 7a. The electrode 17 is bonded to the plate electrode 7 in a plurality of places. Therefore, it is possible to manufacture a semiconductor device in which a vibration or heat in the ultrasonic bonding is dispersed to each of the bonding portions 17a and melting or a crack occurs with difficulty.

Moreover, the protruded portion of the plate electrode 7 has a pair of side surfaces which is perpendicular to the surface of the ultrasonic bonding portion 7b at the opposite side to the bonding plate portion 7a, the step (b) serves to seal the semiconductor chips 5 and the plate electrode 7 with the sealing resin 14 in such a manner that at least a part of each of the pair of side surfaces is exposed, and the step (c) serves to carry out the ultrasonic bonding while performing pressurization with the pair of side surfaces exposed from the sealing resin 14 interposed from both sides. The plate electrode 7 is fixed in the interposing state between the tools 19a and 19b. Consequently, a vibration can be prevented from being generated by the ultrasonic bonding so that the breakdown of the bonding material 6 to the semiconductor chip 5 can be suppressed. Moreover, the heat generated in the ultrasonic bonding can be dissipated to the tools 19*a* and 19*b*. Therefore, the bonding material 6 can be prevented from being molten.

Furthermore, the tools 19*a* and 19*b* have a silicone rubber on the contact surfaces with the pair of side surfaces. Therefore, the vibration of the plate electrode 7 can be absorbed, and an adhesive property of the plate electrode 7 and the tools 19*a* and 19*b* can be enhanced so that a thermal contact resistance can be reduced.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
a plurality of semiconductor chips;
a plate electrode directly disposed via bonding material on said plurality of semiconductor chips for connecting said plurality of semiconductor chips; and
an electrode disposed on said plate electrode on a side of the plate electrode facing away from the plurality of semiconductor chips,
wherein said electrode has a plurality of intermittent bonding portions to be bonded to said plate electrode and a protruded portion which is protruded erectly from said plurality of bonding portions, and said protruded portion has an ultrasonic bonding portion which is parallel with said bonding portion and is ultrasonic bonded to an external electrode.

2. The semiconductor device according to claim 1 further comprising
a sealing resin for sealing a part of said electrode, said semiconductor chips and said plate electrode, said ultrasonic bonding portion of said electrode being exposed from said sealing resin.

3. A semiconductor device comprising:
a plurality of semiconductor chips;
a plate electrode disposed on said plurality of semiconductor chips for connecting said plurality of semiconductor chips; and
an electrode disposed on said plate electrode, wherein
said electrode has a plurality of intermittent bonding portions to be bonded to said plate electrode and a protruded portion which is protruded erectly from said plurality of bonding portions, and said protruded portion has an ultrasonic bonding portion which is parallel with said bonding portion and is ultrasonic bonded to an external electrode; and
wherein said protruded portion of said electrode takes a step bending shape between said bonding portion and said ultrasonic bonding portion.

4. A semiconductor device comprising:
a plurality of semiconductor chips;
a plate electrode disposed on said plurality of semiconductor chips for connecting said plurality of semiconductor chips; and
an electrode disposed on said plate electrode,
wherein said electrode has a plurality of intermittent bonding portions to be bonded to said plate electrode and a protruded portion which is protruded erectly from said plurality of bonding portions, and said protruded portion has an ultrasonic bonding portion which is parallel with said bonding portion and is ultrasonic bonded to an external electrode;
a sealing resin for sealing a part of said electrode, said semiconductor chips and said plate electrode, said ultrasonic bonding portion of said electrode being exposed from said sealing resin; and
said protruded portion of said electrode takes a step bending shape between said bonding portion and said ultrasonic bonding portion.

5. A semiconductor device comprising:
a plurality of semiconductor chips; and
a plate electrode directly disposed via bonding material on said plurality of semiconductor chips,
wherein said plate electrode has a bonding plate portion bonded to said plurality of semiconductor chips for connecting the plurality of semiconductor chips and a protruded portion which is protruded erectly from said bonding plate portion, and said protruded portion has an ultrasonic bonding portion which is parallel with said bonding plate portion and to which an external electrode is ultrasonic bonded.

6. The semiconductor device according to claim 5 further comprising
a sealing resin for sealing a part of said plate electrode and said semiconductor chips, a surface of said ultrasonic bonding portion of said plate electrode at an opposite side to said bonding plate portion being exposed from said sealing resin.

7. A semiconductor device comprising:
a plurality of semiconductor chips; and
a plate electrode disposed on said plurality of semiconductor chips,
wherein said plate electrode has a bonding plate portion bonded to said plurality of semiconductor chips for connecting the plurality of semiconductor chips and a protruded portion which is protruded erectly from said bonding plate portion, and said protruded portion has an ultrasonic bonding portion which is parallel with said bonding plate portion and to which an external electrode is ultrasonic bonded;
wherein said erecting shape in said plate electrode is an almost S shape.

8. A semiconductor device comprising:
a plurality of semiconductor chips; and
a plate electrode disposed on said plurality of semiconductor chips,
wherein said plate electrode has a bonding plate portion bonded to said plurality of semiconductor chips for connecting the plurality of semiconductor chips and a protruded portion which is protruded erectly from said bonding plate portion, and said protruded portion has an ultrasonic bonding portion which is parallel with said bonding plate portion and to which an external electrode is ultrasonic bonded; and
a sealing resin for sealing a part of said plate electrode and said semiconductor chips, a surface of said ultrasonic bonding portion of said plate electrode at an opposite side to said bonding plate portion being exposed from said sealing resin;
wherein said erecting shape in said plate electrode is an almost S shape.

9. A semiconductor device comprising:
a plurality of semiconductor chips; and
a plate electrode disposed on said plurality of semiconductor chips,
wherein said plate electrode has a bonding plate portion bonded to said plurality of semiconductor chips for connecting the plurality of semiconductor chips and a protruded portion which is protruded erectly from said bonding plate portion, and said protruded portion has an ultrasonic bonding portion which is parallel with said bonding plate portion and to which an external electrode is ultrasonic bonded;

a sealing resin for sealing a part of said plate electrode and said semiconductor chips, a surface of said ultrasonic bonding portion of said plate electrode at an opposite side to said bonding plate portion being exposed from said sealing resin;

said plate electrode further comprises a heat radiating portion which is linked from an end of said ultrasonic bonding portion and is not linked to said bonding plate portion, and said heat radiating portion is sealed with said sealing resin.

10. A method of manufacturing a semiconductor device comprising the steps of:

(a) directly bonding via bonding material a plate electrode onto a plurality of semiconductor chips, thereby connecting said plurality of semiconductor chips;

(b) disposing, on said plate electrode on a side of the plate electrode facing away from the plurality of semiconductor chips, an electrode including a plurality of intermittent bonding portions and a protruded portion having an ultrasonic bonding portion which is parallel with said bonding portions and protruded erectly from said bonding portions, and bonding said bonding portions to said plate electrode;

(c) sealing said semiconductor chips, said plate electrode and said electrode with a sealing resin in such a manner that a surface of said ultrasonic bonding portion at an opposite side to said bonding portion is exposed; and (d) ultrasonic bonding an external electrode to the surface of said ultrasonic bonding portion at the opposite side to said bonding portion.

11. A method of manufacturing a semiconductor device comprising the steps of:

(a) bonding a plate electrode onto a plurality of semiconductor chips, thereby connecting said plurality of semiconductor chips;

(b) disposing, on said plate electrode, an electrode including a plurality of intermittent bonding portions and a protruded portion having an ultrasonic bonding portion which is parallel with said bonding portions and protruded erectly from said bonding portions, and bonding said bonding portions to said plate electrode;

(c) sealing said semiconductor chips, said plate electrode and said electrode with a sealing resin in such a manner that a surface of said ultrasonic bonding portion at an opposite side to said bonding portion is exposed; and (d) ultrasonic bonding an external electrode to the surface of said ultrasonic bonding portion at the opposite side to said bonding portion; wherein said protruded portion of said electrode has a pair of side surfaces which is perpendicular to the surface of said ultrasonic bonding portion at the opposite side to said bonding portion, said step (c) serves to seal said semiconductor chips, said plate electrode and said electrode with said sealing resin in such a manner that at least a part of each of said pair of side surfaces is exposed, and said step (d) serves to carry out said ultrasonic bonding while performing pressurization with said pair of side surfaces exposed from said sealing resin interposed by pressurizing members from both sides.

12. The method of manufacturing a semiconductor device according to claim 11, wherein said pressurizing members have a silicone rubber on contact surfaces with said pair of side surfaces.

13. A method of manufacturing a semiconductor device comprising the steps of:

(a) directly disposing via bonding material, on a plurality of semiconductor chips, a plate electrode including a plurality of bonding plate portions and a protruded portion having an ultrasonic bonding portion which is parallel with said bonding plate portions and protruded erectly from said bonding plate portions, and bonding said bonding plate portion to said semiconductor chips;

(b) sealing said semiconductor chips and said plate electrode with a sealing resin in such a manner that a surface of said ultrasonic bonding portion at an opposite side to said bonding plate portion is exposed; and (c) ultrasonic bonding an external electrode to said surface of said ultrasonic bonding portion at the opposite side to said bonding plate portion.

14. A method of manufacturing a semiconductor device comprising the steps of:

(a) disposing, on a plurality of semiconductor chips, a plate electrode including a plurality of bonding plate portions and a protruded portion having an ultrasonic bonding portion which is parallel with said bonding plate portions and protruded erectly from said bonding plate portions, and bonding said bonding plate portion to said semiconductor chips;

(b) sealing said semiconductor chips and said plate electrode with a sealing resin in such a manner that a surface of said ultrasonic bonding portion at an opposite side to said bonding plate portion is exposed; and (c) ultrasonic bonding an external electrode to said surface of said ultrasonic bonding portion at the opposite side to said bonding plate portion; wherein said protruded portion of said plate electrode has a pair of side surfaces which is perpendicular to the surface of said ultrasonic bonding portion at the opposite side to said bonding plate portion, said step (b) serves to seal said semiconductor chips and said plate electrode with said sealing resin in such a manner that at least a part of each of said pair of side surfaces is exposed, and said step (c) serves to carry out said ultrasonic bonding while performing pressurization with said pair of side surfaces exposed from said sealing resin interposed by pressurized members from both sides.

15. The method of manufacturing a semiconductor device according to claim 14, wherein said pressurizing members have a silicone rubber on contact surfaces with said pair of side surfaces.

* * * * *